(12) United States Patent
Chen et al.

(10) Patent No.: US 12,222,395 B2
(45) Date of Patent: Feb. 11, 2025

(54) METHOD, APPARATUS AND DEVICE FOR IDENTIFYING BATTERY PARAMETERS AND STORAGE MEDIUM

(71) Applicant: Shanghai Makesens Energy Storage Technology Co., Ltd., Shanghai (CN)

(72) Inventors: Xiaohua Chen, Shanghai (CN); Zhimin Zhou, Shanghai (CN); Qiong Wei, Shanghai (CN); Xiao Yan, Shanghai (CN); Enhai Zhao, Shanghai (CN); Pingchao Hao, Shanghai (CN); Zhou Yang, Shanghai (CN)

(73) Assignee: SHANGHAI MAKESENS ENERGY STORAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 18/522,394

(22) Filed: Nov. 29, 2023

(65) Prior Publication Data
US 2024/0295607 A1 Sep. 5, 2024

(30) Foreign Application Priority Data
Mar. 1, 2023 (CN) .......................... 202310187172.3

(51) Int. Cl.
G01R 31/367 (2019.01)
(52) U.S. Cl.
CPC .................. *G01R 31/367* (2019.01)
(58) Field of Classification Search
CPC .. G01R 31/367; G01R 31/36; G01R 31/3644; Y02E 60/10; G06N 3/006
See application file for complete search history.

(56) References Cited

U.S. PATENT DOCUMENTS

| 6,993,377 B2 * | 1/2006 | Flick ................... A61B 5/7275 |
| | | 600/509 |
| 10,252,145 B2 * | 4/2019 | Tran ....................... G06V 40/28 |
| (Continued) | | |

FOREIGN PATENT DOCUMENTS

| CN | 101739602 A | 6/2010 |
| CN | 104298873 A | 1/2015 |
| (Continued) | | |

OTHER PUBLICATIONS

Chinese Office Action Corresponding to Application No. 202310187172. 3, mailed Aug. 17, 2023.

*Primary Examiner* — Tung S Lau
(74) *Attorney, Agent, or Firm* — Yue (Robert) Xu; Apex Attorneys at Law, LLP

(57) ABSTRACT

A method, an apparatus and a device for identifying battery parameters, and a storage medium are provided. The method includes: determining to-be-identified parameters of the battery and determining an initial population; performing a screening step with the initial population as a current population: for at least part of individuals in the current population, updating positions of the individuals in the current population through local optimization and generating corresponding first individuals, and updating the positions of the individuals in the current population through Levy flight and generating corresponding second individuals; selecting an optimal individual according to fitness of the individuals in the current population and the corresponding first individuals and the corresponding second individuals, as an individual in the next generation population; repeating the above screening step until a termination condition is met, to obtain a final population; and determining the to-be-identified parameters included in the optimal individual in the final population as the parameters of the battery. With the method, the apparatus and the device for identifying battery (Continued)

parameters and the storage medium, the speed of parameter identification is effectively improved.

8 Claims, 3 Drawing Sheets

(56) References Cited

U.S. PATENT DOCUMENTS

| | | | |
|---|---|---|---|
| 10,319,574 B2* | 6/2019 | Jo | H01J 49/0418 |
| 11,577,625 B1* | 2/2023 | Foland | G06N 5/01 |
| 2003/0163057 A1* | 8/2003 | Flick | A61B 5/7275 |
| | | | 600/509 |
| 2008/0091471 A1* | 4/2008 | Michon | G16B 40/20 |
| | | | 705/3 |
| 2021/0358310 A1* | 11/2021 | Sachs | G08G 5/003 |

FOREIGN PATENT DOCUMENTS

| | | | | |
|---|---|---|---|---|
| CN | 106951910 A | | 7/2017 | |
| CN | 111079615 Y | | 4/2020 | |
| CN | 112103580 A | * | 12/2020 | G06F 30/20 |
| CN | 113640690 A | * | 11/2021 | G06N 3/08 |
| CN | 114531665 A | | 5/2022 | |
| CN | 114779089 Y | | 7/2022 | |
| CN | 114936524 A | | 8/2022 | |
| CN | 115102586 A | | 9/2022 | |
| WO | 2018036282 A | | 3/2018 | |

* cited by examiner

METHOD, APPARATUS AND DEVICE FOR IDENTIFYING BATTERY PARAMETERS AND STORAGE MEDIUM

CROSS-REFERENCE TO RELATED APPLICATION

This application claims priority to Chinese Patent Application No. 202310187172.3, filed on Mar. 1, 2023, which is incorporated herein by its reference in its entirety.

FIELD

The present disclosure relates to the technical field of parameter identification for batteries, and specifically to a method, an apparatus and a device for identifying parameters of a battery and a storage medium.

BACKGROUND

In recent years, renewable energy has developed rapidly. As an important supporting technology, energy storage power stations that use ultra-large battery packs to store electricity have ushered in rapid development. Lithium-ion batteries have become the mainstream battery technology in domestic energy storage power stations due to their various advantages. However, lithium electronic batteries are prone to over-discharge, overcharge, overheating and degradation during actual application, which ultimately leads to reduced battery performance or even failure. In order to ensure safe operation and effective energy management of lithium batteries, it is necessary to identify the internal parameters of lithium-ion batteries, and then effectively and accurately monitor the physical and chemical changes inside the lithium-ion batteries.

Currently, there are relatively practical and accurate electrochemical models in scientific research and practical engineering, for example, the pseudo-two-dimensional (P2D) model of lithium-ion batteries, which can effectively reflect the internal physical and chemical processes inside lithium-ion batteries during use. When accurate parameter values are obtained, the P2D model can accurately simulate the internal state of the battery.

However, the existing parameter identification solution has some problems. For example, it is difficult for the identification to converge due to high-dimensional parameters of the P2D model, and the identification speed is not ideal.

SUMMARY

In order to solve the existing technical problems, a method, an apparatus and a device for identifying parameters of a battery, and a storage medium are provided according to embodiments of the present application.

In a first aspect, a method for identifying parameters of a battery is provided according to an embodiment of the present application. The method includes: determining to-be-identified parameters of the battery and determining an initial population, where the initial population includes N individuals each including all the to-be-identified parameters; performing a screening step with the initial population as a current population: for at least part of individuals in the current population, updating positions of the individuals in the current population through local optimization and generating corresponding first individuals, and updating the positions of the individuals in the current population through Levy flight and generating corresponding second individuals; selecting an optimal individual according to fitness of the individuals in the current population and the corresponding first individuals and the corresponding second individuals, as an individual in a next generation population, where the next generation population is determined as the current population in a next round of screening step; and repeating the above screening step until a termination condition is met, to obtain a final population; and determining the to-be-identified parameters included in the optimal individual in the final population as the parameters of the battery.

In a second aspect, an apparatus for identifying parameters of a battery is provided according to an embodiment of the present application. The apparatus includes: a determination module, a screening module, an iteration determination module and an output module. The determination module is configured to determine to-be-identified parameters of the battery and determine an initial population. The initial population includes N individuals each including all the to-be-identified parameters, and the initial population is determined as a current population. The screening module is configured to perform a screening step: for at least part of individuals in the current population, updating positions of the individuals in the current population through local optimization and generating corresponding first individuals, updating the positions of the individuals in the current population through Levy flight and generating corresponding second individuals; selecting an optimal individual as an individual in the next generation population according to fitness of the individuals in the current population and the corresponding first individuals and the corresponding second individuals. The next generation population is determined as the current population for a next round of screening. The iteration determination module is configured to repeat the screening step until the termination condition is met, to obtain a final population. The output module is configured to determine the to-be-identified parameters included in the optimal individual in the final population as the parameters of the battery.

In a third aspect, a device for identifying parameters of a battery is provided according to an embodiment of the present application. The device includes a processor and a memory. The memory stores a computer program. The processor executes the computer program stored in the memory to implement the method described in the first aspect.

In a fourth aspect, a computer-readable storage medium, on which a computer program is stored, is provided according to an embodiment of the present application. The computer program, when executed by a processor, implements the method described in the first aspect.

With the method, the apparatus and the device for identifying parameters of a battery and the computer-readable storage medium, the Levy flight and the local optimization are performed in parallel during population screening. Then, the optimal individual is selected from the sample individuals and the corresponding first and second individuals as the individual in the next generation population. In the traditional cuckoo algorithm, the levy flight and the local optimization are performed in series, which is less efficient, difficult to find the optimal solution quickly, and the convergence speed is low. In the embodiments of the present disclosure, the levy flight and the local optimization are performed in parallel, so that the processing efficiency is high. Further, the optimal individual is selected from the sample individuals, the first individuals, and the second individuals, that is, the better individual can be retained, so that the population obtained in the present round of screening is better. Therefore, the optimal solution can be found faster, the convergence speed is higher, and the speed of parameter identification is effectively improved.

BRIEF DESCRIPTION OF THE DRAWINGS

The drawings to be used in the embodiments of the present application or the background art are described below in order to more clearly illustrate the technical solutions in the embodiments of the present application or the background art.

DETAILED DESCRIPTION

Embodiments of the present application are described below with reference to the drawings in the embodiments of the present application.

Figure 1:
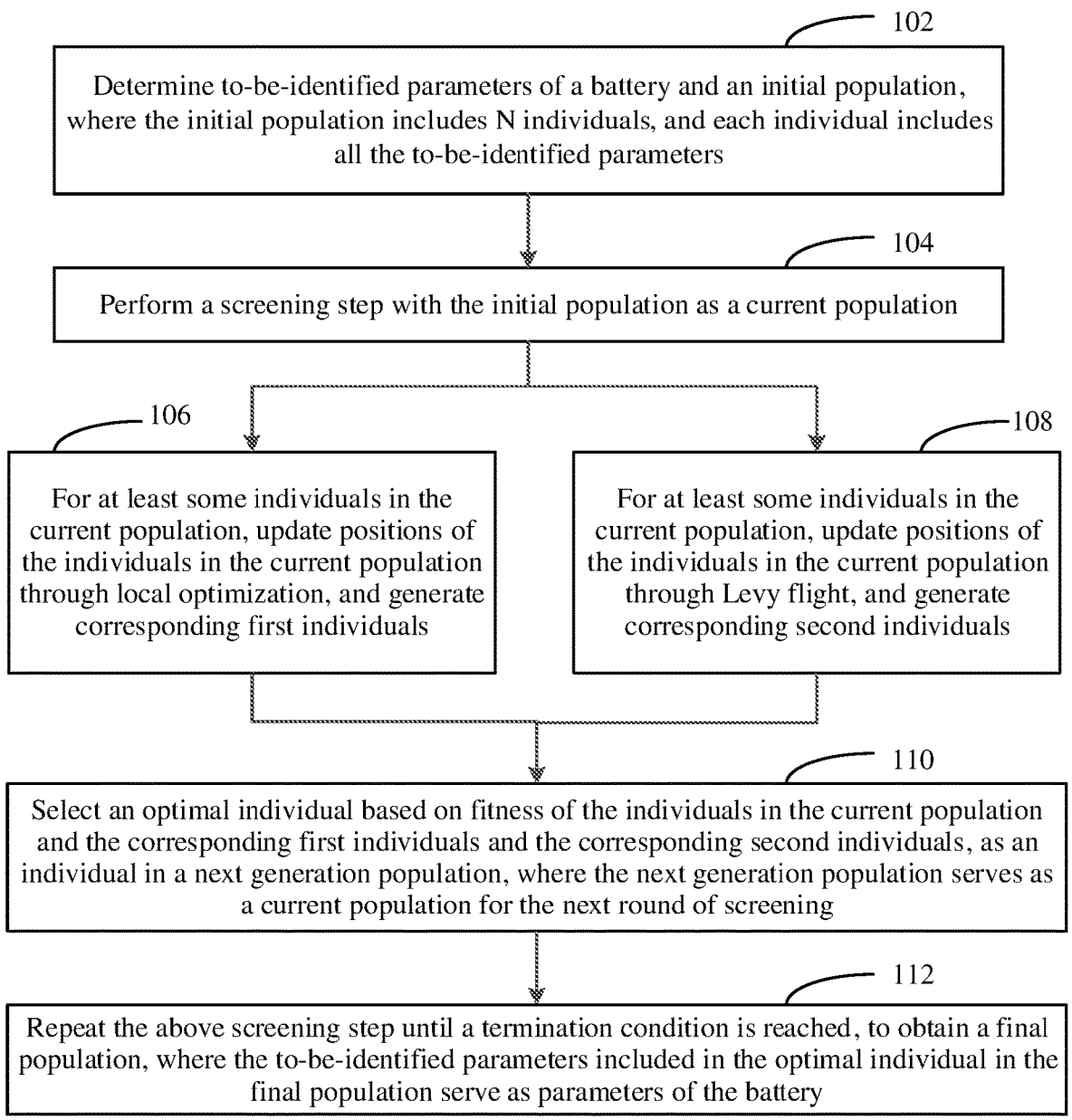
FIG. 1 is a flow chart of a method for identifying parameters of a battery according to an embodiment of the present application.

In the method for identifying parameters of a battery according to embodiments of the present disclosure, an improved cuckoo algorithm is introduced to identify parameters of the battery, thereby providing powerful algorithm support for the practical application of the battery model. FIG. 1 shows a flow chart of the method for identifying parameters of a battery according to an embodiment of the present disclosure. As shown in FIG. 1. The method includes the following steps 102 to 112.

In step 102, to-be-identified parameters of the battery are determined and an initial population is determined. The initial population includes N individuals, and each individual includes all the to-be-identified parameters.

In the embodiments of the present disclosure, there are relatively practical and accurate electrochemical models in scientific research and practical engineering, for example, the pseudo-two-dimensional (P2D) model of lithium-ion batteries, which can effectively reflect the internal physics and chemistry process of the lithium-ion batteries during use. When accurate parameter values are obtained, the P2D model can accurately simulate the state inside the battery. This embodiment establishes a P2D model in practical applications and obtains to-be-identified parameters (i.e., parameters to be identified). The method of obtaining the to-be-identified parameters includes but is not limited to: obtaining the threshold range of each parameter from a literature or an existing database, and selecting the undetermined parameters. The undetermined parameters include, but are not limited to, highly sensitive parameters selected through sensitivity analysis as unidentified parameters of the battery, for example, an electrode thickness L, conductivity κ, active material volume fraction $\varepsilon_s$, a particle radius $R_p$, an electrode area A, maximum lithium concentration $C_{s,max}$, SEI internal resistance $R_f$, a solid phase diffusion coefficient $D_s$. Other parameters of the P2D are obtained according to experimental and literature values, and the parameter values are allowed to fluctuate within a small range.

The initial population X is randomly selected. The initial population includes N individuals. For example, an $i^{th}$ individual in the population may be expressed as $x_i$, and i=1, 2, . . . , N. Each individual includes all the to-be-identified parameters. For example, the number of to-be-identified parameters is D. Each individual may be represented by a D-dimensional array. A $d^{th}$ to-be-identified parameter in the individual $x_i$ may be expressed as $x_{i,d}$, and d=1, 2, . . . , D.

In step 104, a screening step is performed with the initial population as a current population.

In order to obtain a better population, the screening is performed with the initial population as the current population. That is, the current population in the first round of screening is the initial population. The screening is to be iterated at least once. A population is processed each time the screening is performed. For convenience of description, this population is called the current population.

The screening includes the following steps 106 to 110. At least a part of the individuals in the current population are selected. For each selected individual, steps 106 and 108 are performed, followed by step 110.

In step 106, for at least some individuals in the current population, positions of the individuals in the current population are updated through local optimization, and corresponding first individuals are generated.

In step 108, for at least some individuals in the current population, the positions of the individuals in the current population are updated through Levy flight, and corresponding second individuals are generated.

For convenience of description, the individuals in the current population targeted in steps 106 and 108 are called sample individuals. The local optimization is the way to implement local search in the cuckoo algorithm. During the local optimization, a detection probability is set to randomly migrate individuals. The expression of local optimization is as follows.

$$x_i^{t'} = x_i^t + r_1 \otimes H(P_a - r_2) \otimes (x_j^t - x_k^t) \quad (1)$$

$x_i^t$ is the position of the $i^{th}$ sample individual in the $t^{th}$ round (for example, the $t^{th}$ screening). $x_i^{t'}$ is a new position of the $i^{th}$ sample individual after random migration, that is, the position of the corresponding first individual. $r_1$ and $r_2$ are random number vectors, and the range of their random numbers is [0, 1]. $P_a$ represents the detection probability. For example, $P_a$ is of 0.25. $x_j^t$ and $x_k^t$ respectively represent two randomly selected individuals in the population. H( ) is the Heaviside function. The position of the sample individual is updated according to the above expression, and the first individual corresponding to the sample individual is determined. Each sample individual can generate the corresponding first individual.

For the sample individuals, the positions of the sample individuals in the current population are also updated through Levy flight. The expression for the levy flight is as follows.

$$x_i^{t''} = x_i^t + \alpha Levy(\beta) \quad (2)$$

$x_i^t$ is the position of the $i^{th}$ sample individual in the $t^{th}$ round (for example, the $t^{th}$ screening). $x_i^{t''}$ is a new position of the $i^{th}$ sample individual after the levy flight, that is, the position of the corresponding second individual. α represents the step size, α>0, for example, α=1. According to the above expression, the position of the sample individual is updated, and the second individual corresponding to the sample individual is determined. Each sample individual can generate a corresponding second individual.

In step 110, based on fitness of the individuals in the current population and the corresponding first individuals and the corresponding second individuals, an optimal individual is selected as an individual in the next generation population. The next generation population serves as the current population for the next round of screening.

In step 112, the above screening step is repeated until a termination condition is reached, to obtain a final population. The to-be-identified parameters included in the optimal individual in the final population serve as parameters of the battery.

In order to select a better population and maintain diversity of the population, select the individual with higher fitness (that is, the optimal individual in step 110 above) is selected based on the fitness of the individuals in the current population and the corresponding first individuals and the corresponding second individuals, as the individual in the target population, so that the target population is formed. The target population is a newly generated population.

The termination condition of the iteration is set in advance. For example, the maximum number of iterations is set. When the iteration round reaches the maximum number of iterations, the termination condition is reached and the iteration ends. Alternatively, it is determined whether there is an individual in the target population whose fitness meets the requirements. If there is an individual in the target population whose fitness meets the requirements, the termination condition is reached and the iteration ends. After the target population is formed, it is determined whether relevant parameters of the target population meet the termination condition. If the termination condition is met, the target population is determined as the final population. The to-be-identified parameters included in the optimal individual in the final population are selected as the parameters of the battery. For example, the optimal individual is $x_i$, and the to-be-identified parameters included in $x_i$ may be expressed as $[x_{i1}, x_{i2}, \ldots, x_{iD}]$. The parameters $x_{i1}, x_{i2}, \ldots, x_{iD}$ are obtained by identification. If the termination condition is not met, the target population is determined as the next generation population and the screening is performed again.

With the method for identifying parameters of a battery according to the embodiments of the present disclosure, the Levy flight and the local optimization are performed in parallel during population screening. Then, the optimal individual is selected from the sample individuals and the corresponding first and second individuals as the individual in the next generation population. In the traditional cuckoo algorithm, the levy flight and the local optimization are performed in series, which is less efficient, difficult to find the optimal solution quickly, and the convergence speed is low. In the embodiments of the present disclosure, the levy flight and the local optimization are performed in parallel, resulting in higher processing efficiency. Further, the optimal individual is selected from the sample individuals, the first individuals, and the second individuals, that is, the better individual can be retained, so that the population obtained in the present round of screening is better. Therefore, the optimal solution can be found faster, the convergence speed is higher, and the speed of parameter identification is effectively improved.

In the embodiments of the present disclosure, optionally, the method of calculating the fitness includes, but is not limited to, the difference between the actual selected operating conditions and the operating conditions determined based on the battery model corresponding to the to-be-identified parameters. The selected operating conditions refer to the actual operating conditions or the operating conditions obtained from experiments. Preferably, the remaining state of charge (SOC) under actual operating conditions is greater than 50%. The selected operating conditions may include at least one charge-discharge curve between dynamic operating conditions and constant current operating conditions. Embodiments of the present disclosure may adopt experimental constant current and dynamic operating conditions solutions.

For example, the operating condition may be the voltage, and the fitness is calculated from the following expression.

$$f = \frac{1}{m}\sum_{i=1}^{m}\left(\hat{V}_i - \vec{V}_i\right)^2 \quad (3)$$

f represents the fitness of the individual. $\hat{V}_i$ is the voltage at an $i^{th}$ point determined based on the battery model corresponding to a certain set of to-be-identified parameters, for example, the voltage at the $i^{th}$ time point. $\vec{V}_i$ is the actual voltage at the $i^{th}$ point. m represents the number of voltage values in this operating condition.

In the embodiments of the present disclosure, optionally, step 106 of "updating the positions of individuals in the current population through local optimization" may include the following step A1.

In step A1, the detection probability of the individual in the current population is calculated based on the fitness of the individual in the current population. Based on the detection probability, the positions of individuals in the current population are updated through the local optimization. There is a positive correlation between the detection probability of the individual and the fitness of the individual.

Each individual in the population has its own fitness. In the embodiments of the present disclosure, different discovery probabilities are adaptively set for individuals according to different fitness. According to the fitness of the sample individual and the fitness of the best individual and the worst individual in the population, the detection probability of each sample individual is calculated. For example, the detection probability is calculated from the following expression.

$$p_i = p_a \left| \frac{f_i - f_{best}}{f_{worst} - f_{best}} \right| \quad (4)$$

$p_i$ represents the detection probability of the $i^{th}$ individual. $p_a$ represents the maximum detection probability. $f_i$ represents the fitness of the $i^{th}$ individual. $f_{best}$ and $f_{worst}$ represent the fitness of the best individual and the worst individual respectively.

In the cuckoo algorithm, the greater the detection probability, the smaller the probability of individuals performing random migration. The detection probability in the general cuckoo algorithm is constant. In order to accelerate iterative convergence and improve identification accuracy, the detection probability in the embodiments of the present disclosure is calculated based on the fitness of each individual. Specifically, a positive correlation exists between the detection probability and the fitness. That is, the greater the fitness, the greater the detection probability. The greater the fitness of an individual, the worse the individual is. In the embodiments of the present disclosure, a greater detection probability is set for the individual, and the easier it is for the individual to be discovered, for random migration. On the contrary, if the fitness of an individual is smaller, the individual is better. In the embodiments of the present disclosure, a smaller detection probability is set for the individual, so that the individual is less likely to be discovered. Therefore, the individual is more likely to be retained to the next generation, thereby accelerating the iterative convergence and improving the identification accuracy.

For example, after the detection probability $p_i$ of the $i^{th}$ individual is determined, the position of the $i^{th}$ individual is updated according to the random migration as shown in the above expression (1). $P_a$ in the above expression (1) is replaced with the detection probability $p_i$.

In the embodiments of the present disclosure, optionally, step 108 of "updating the positions of individuals in the current population through Levy flight" includes the following step B1.

In step B1, the step size used in levy flight is determined based on the number of screenings. The positions of individuals in the current population are updated via the Levy flight. There is a negative correlation between the step size and the number of screenings.

Generally, the step size in the cuckoo algorithm is constant. In order to accelerate iterative convergence and improve identification accuracy, the step size in the embodiments of the present disclosure is calculated based on the current number of screenings. There is a negative correlation between the step size and the number of iterations. That is, the greater the number of screenings (that is, the more rounds of screening are performed, or the greater the number of iterations), the smaller the step size. Specifically, since the initial accuracy of the population is generally low, a larger step size is set for the individual for rough screening in the embodiments of the present disclosure, so that the Levy flight is more efficient. As the number of screenings increases, individuals in the population gradually approach the optimal solution. A correspondingly smaller step size is set for the individual for fine screening in the embodiments of the present disclosure, thereby improving the identification accuracy.

For example, when the screening is performed for the $t^{th}$ round, that is, when the number of iterations is t, the step size is calculated form the following expression (5). Then the position of the $i^{th}$ individual is updated according to the Levy flight as shown in the above expression (2).

$$\alpha = \alpha_0 + \frac{\alpha_{range}}{1 + \exp^{(a(t-bT))}} \quad (5)$$

$\alpha$ represents the step size in the Levy flight. $\alpha_0$ represents the initially set step size. $\alpha_{range}$ represents the range of the step size. T is the maximum number of screenings. t is the current number of screenings. a and b represent the set constant, 0<a<1, and ⅓<b<⅔.

In the embodiments of the present disclosure, optionally, the screening further includes the following step C1 before the local optimization and the Levy flight, that is, before the above step 106 and step 108.

In step C1, for at least some individuals in the current population, the positions of individuals in the current population are updated through gravitational search, and corresponding intermediate individuals are generated. According to the fitness of the individuals in the current population and the corresponding intermediate individuals, the optimal individual is selected as the individual of the current population in the current screening.

In order to increase the connection between individuals within the population and share information among individuals within the population, thereby improving the speed and the identification accuracy, for at least some individuals in the current population that involved into the screening each time, the positions of the individuals in the current population are updated through gravitational search according to the fitness of the individual, and the corresponding intermediate individuals are generated in the embodiments of the present disclosure. According to the fitness of the individuals in the current population and the corresponding intermediate individuals, the optimal individual is selected as the individual of the current population in the current screening. Then, local optimization and Levy flight are performed on the individuals in the current population, that is, the above steps 106 and 108 are performed.

In the embodiments of the present disclosure, optionally, the determining the initial population in step 102 includes the following step D1.

In step D1, a random population is obtained based on the chaos operator initialization. A reverse population is calculated for the random population. The random population and the reverse population are merged. A new population is selected according to the fitness of each individual as the initial population.

In order to speed up the identification convergence, the population is initialized through the chaos operator as follows. The population X={$x_i$, i=1, 2, ..., N}, $x_i$={$x_{id}$, d=1, 2, ..., D} is obtained through the chaos operator. The reverse population OX={$ox_i$, i=1, 2, ..., N}, $ox_i$={$ox_{id}$, d=1, 2, ..., D} is obtained from the population X. The population X is merged with the reverse population OX to obtain a new population {X∪OX}. The fitness of the new population is calculated and sorted, and N individuals with better fitness are selected as the initial population.

Figure 2:
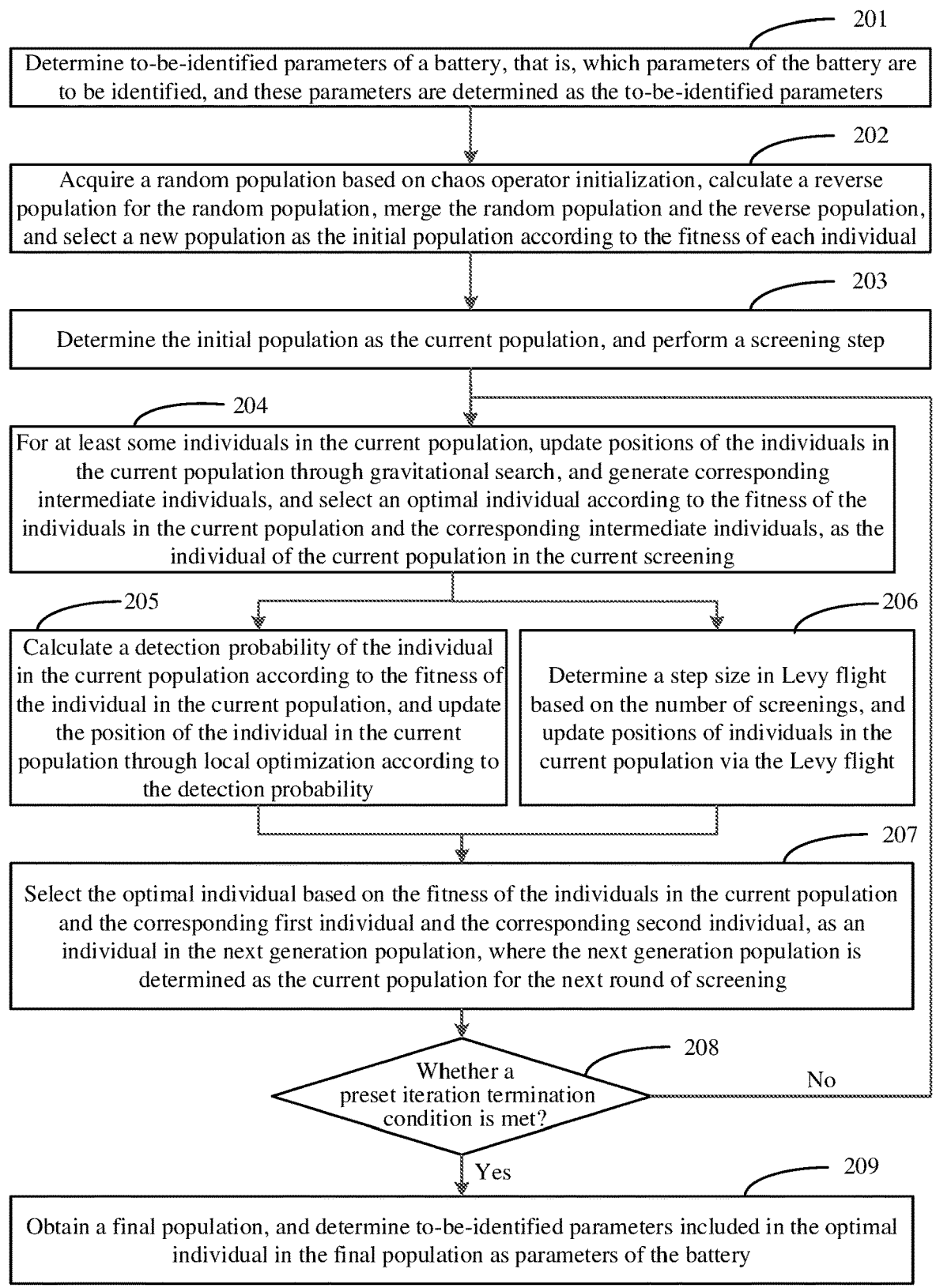
FIG. 2 is a flow chart of the method for identifying parameters of the battery according to another embodiment of the present application.

The method for identifying parameters of the battery is also provided according to another embodiment of the present disclosure. By introducing chaos operator initialization population, the gravitational search and the improved cuckoo algorithm, battery parameter identification is realized, thereby providing strong algorithm support for the practical application of battery models. FIG. 2 shows a flow chart of the method for identifying parameters of the battery according to embodiments of the present disclosure. As shown in FIG. 2, the method includes the following steps 201 to 209.

In step 201, to-be-identified parameters of the battery are determined. That is, which parameters of the battery are to be identified are determined, and these parameters are determined as the to-be-identified parameters.

In step 202, a random population is obtained based on chaos operator initialization. A reverse population is calculated for the random population. The random population and the reverse population are merged, and a new population is selected as the initial population according to the fitness of each individual. The initial population includes N individuals, and each individual includes all the to-be-identified parameters.

In step 203, the initial population is determined as the current population, and a screening step is performed.

The initial population is the current population in the first round of screening. Before the screening step, it is determined whether the preset iteration termination condition is met. If the termination condition is met, the initial population is directly determined as the final population. If the termination condition is not met, the filtering step is performed. The screening includes the following steps 204 to 207. At least some individuals (e.g., all individuals) in the current population are selected. For each selected individual, step 204 is performed. Then, for each individual after the gravitational search, step 205 and step 206 are performed. Then, step 207 is performed.

In step 204, for at least some individuals in the current population, the positions of the individuals in the current population are updated through gravitational search, and corresponding intermediate individuals are generated. According to the fitness of the individuals in the current population and the corresponding intermediate individuals, the optimal individual is selected as the individual of the current population in the current screening.

In step 205, the detection probability of the individual in the current population is calculated according to the fitness of the individual in the current population. According to the detection probability, the position of the individual in the current population is updated through local optimization. The detection probability of the individual is positively correlated with the fitness of the individual.

In step 206, the step size in the Levy flight is determined based on the number of screenings. The positions of individuals in the current population are updated via the Levy flight. There is a negative correlation between the step size and the number of screenings.

In step 207, based on the fitness of the individuals in the current population and the corresponding first individual and the corresponding second individual, the optimal individual is selected as an individual in the next generation population. The next generation population is determined as the current population for the next round of screening.

For example, for an individual A in the current population, a first individual B corresponding to the individual A is determined through local optimization. A second individual C corresponding to the individual A is determined through Levy flight. Based on the fitness of the individual A, the first individual B, and the second individual C, the optimal individual is selected from the three as the individual in the next generation population. Other individuals in the current population may also be selected in the above manner, and finally the next generation population is generated.

In step 208, it is determined whether the preset iteration termination condition is met. If the termination condition is met, the next generation population is determined as the final population, and step 209 is performed. If the termination condition is not met, the screening step is reperformed.

In step 209, the final population is obtained. The to-be-identified parameters included in the optimal individual in the final population are determined as parameters of the battery.

The method for identifying parameters of the battery according to the embodiments of the present disclosure is described in detail above. This method may also be implemented by a corresponding device. The device for identifying parameters of the battery according to the embodiments of the present disclosure is described in detail below.

Figure 3:
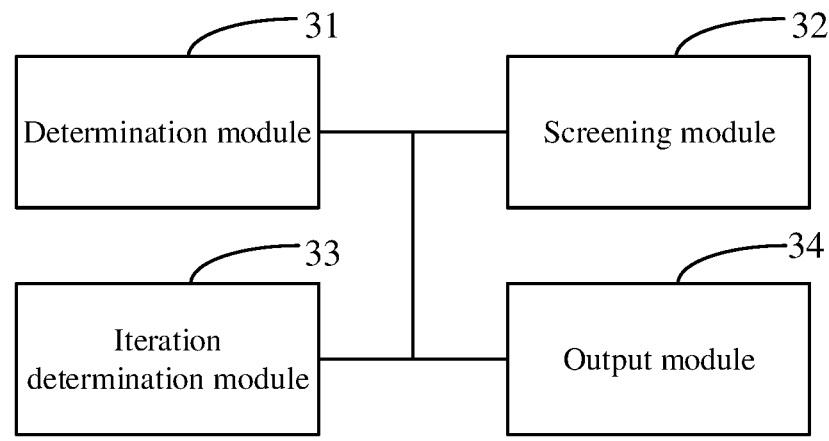
FIG. 3 is a structural diagram of an apparatus for identifying parameters of a battery according to an embodiment of the present application.

FIG. 3 shows a schematic structural diagram of an apparatus for identifying parameters of the battery according to an embodiment of the present disclosure. As shown in FIG. 3, the apparatus for identifying parameters of the battery includes a determination module 31, a screening module 32, an iteration determination module 33 and an output module 34.

The determination module 31 is configured to determine the to-be-identified parameters of the battery and determine the initial population. The initial population includes N individuals. Each individual includes all the to-be-identified parameters. The initial population serves as the current population.

The screening module 32 is configured to perform the screening step: for at least some individuals in the current population, updating the positions of the individuals in the current population through local optimization and generating the corresponding first individuals, updating the positions of the individuals in the current population through Levy flight and generating the corresponding second individuals; selecting an optimal individual as an individual in the next generation population according to the fitness of the individuals in the current population and the corresponding first individuals and the corresponding second individuals. The next generation population is determined as the current population for the next round of screening.

In the embodiments of the present disclosure, optionally, the screening module 32 may include a local optimization module and/or a Levy flight module.

The local optimization module is configured to update the positions of the individuals in the current population through local optimization and generate the corresponding first individuals. The local optimization module is specifically configured to calculate the detection probability of individuals in the current population according to the fitness of the individuals in the current population; and update the positions of the individuals in the current population through local optimization according to the detection probability. There is a positive correlation between the detection probability of the individual and the fitness of the individual.

The Levy flight module is configured to update the positions of the individuals in the current population through Levy flight and generate the corresponding second individuals. The Levy flight module is specifically configured to determine the step size in Levy flight according to the number of screenings, and update the positions of the individuals in the current population through the Levy flight. There is a negative correlation between the step size and the number of screenings.

The iteration determination module 33 is configured to repeat the above screening step until the termination condition is met, to obtain a final population.

The output module 34 is configured to determine the to-be-identified parameters included in the optimal individuals in the final population as parameters of the battery.

In the embodiments of the present disclosure, optionally, the determination module 31 may include an initialization module.

The initialization module is configured to acquire a random population based on chaos operator initialization, calculate a reverse population for the random population, merge the random population and the reverse population, and select a new population based on the fitness of each individual, as the initial population.

In the embodiments of the present disclosure, optionally, the screening module 32 may also include a gravitational search module.

The gravitational search module is configured to, in the screening and before the local optimization and the Levy flight calculations, for at least some individuals in the current population, update the positions of the individuals in the current population through gravitational search and generate corresponding intermediate individuals; and select the optimal individual as the individual in the current population in the current screening based on the fitness of the individuals in the current population and the corresponding intermediate individuals.

Optionally, the local optimization module calculates the detection probability of individuals in the current population according to the fitness of the individuals in the current population through the following expression $$p_i = p_a \left| \frac{f_i - f_{best}}{f_{worst} - f_{best}} \right|.$$

$p_i$ represents the detection probability of the $i^{th}$ individual. $p_a$ represents the maximum detection probability. $f_i$ represents the fitness of the $i^{th}$ individual. $f_{best}$ and $f_{worst}$ represent the fitness of the best individual and the worst individual respectively.

Optionally, the Levy flight module determines the step size in the Levy flight according to the number of screenings through the following expression $$\alpha = \alpha_0 + \frac{\alpha_{range}}{1 + \exp^{(a(t-bT))}}.$$

$\alpha$ represents the step size in the Levy flight. $\alpha_0$ represents the initially set step size. $\alpha_{range}$ represents the range of the step size. T is the maximum number of screenings. t is the current number of screenings. a and b represent the set constant, $0<a<1$, and $1/3<b<2/3$.

It should be noted that when the apparatus for identifying parameters of the battery in the above embodiment implements corresponding functions, only the division of the above functional modules is used as an example. In practice, the above functions may be allocated to different functional modules as needed. That is, the internal structure of the apparatus is divided into different functional modules to implement all or part of the functions described above. In addition, the apparatus for identifying parameters of the battery in the above embodiments and the method embodiment for identifying parameters of the battery belong to the same concept. The specific implementation process can be found in the method embodiments and thus is not described again here.

In an aspect of the present application, a computer program product is also provided according to an embodiment of the present disclosure. The computer program product includes a computer program. The computer program includes program code for performing the method illustrated in the flowchart. In such embodiments, the computer program may be downloaded and installed from the network via the communications component. When the computer program is executed by the processor, the method for identifying parameters of the battery according to the embodiments of the present application is performed.

In addition, a device for identifying parameters of a battery is also provided according to an embodiment of the present disclosure. The device includes a processor and a memory. The memory stores a computer program, and the processor is configured to execute the computer program stored in the memory to implement the method for identifying parameters of the battery according to the above embodiments.

Figure 4:
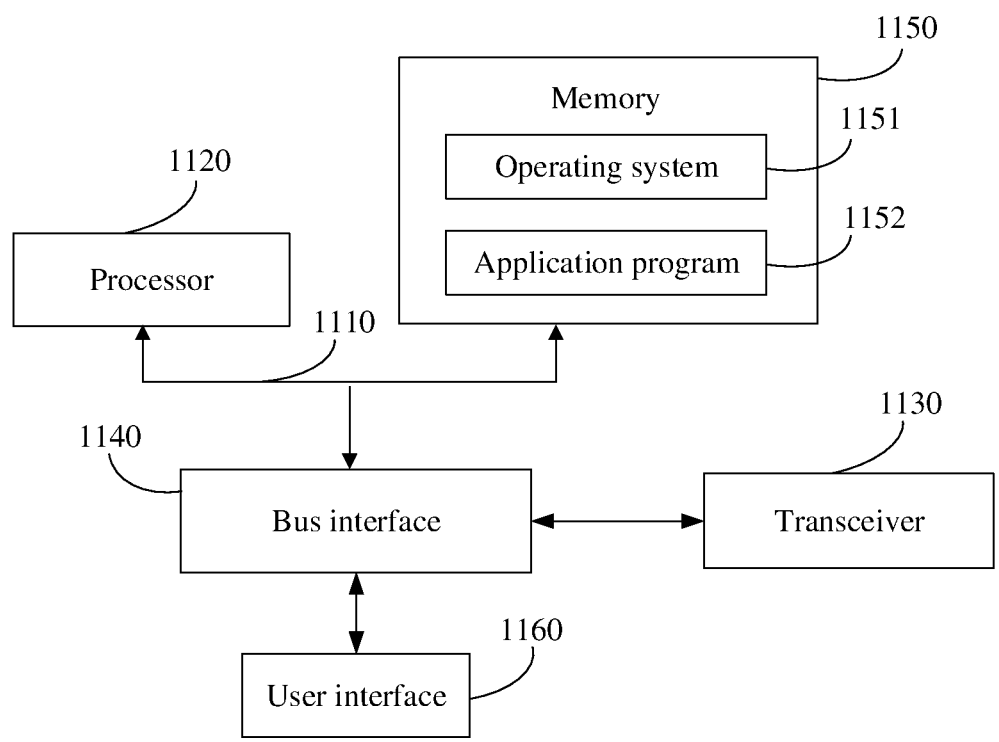
FIG. 4 is a structural diagram of a device for identifying parameters of a battery according to an embodiment of the present application.

For example, FIG. 4 shows a device for identifying battery parameters provided by an embodiment of the present disclosure. The device includes a bus 1110, a processor 1120, a transceiver 1130, a bus interface 1140, a memory 1150, and a user interface 1160.

In an embodiment of the present disclosure, the device further includes a computer program stored on the memory 1150 and executable on the processor 1120. When the computer program is executed by the processor 1120, each process of the method embodiment of identifying parameters of the battery is implemented.

The transceiver 1130 is configured to receive and transmit data under control of the processor 1120.

In the embodiment of the present disclosure, a bus structure (represented by the bus 1110) includes any number of interconnected buses and bridges. The bus 1110 connects various circuits including one or more processors represented by the processor 1120 and a memory represented by the memory 1150 together.

The bus 1110 represents one or more of any one of several types of bus structures, including a memory bus and a memory controller, a peripheral bus, an accelerated graphic port (AGP), a processor or a local bus using any bus structure among various bus architectures. For illustration rather than limitation, such architectures include: an industry standard architecture (ISA) bus, a micro channel architecture (MCA) bus, an extended ISA (EISA) bus, a video electronics standard association (VESA), and a peripheral component interconnect (PCI) bus.

The processor 1120 may be an integrated circuit chip with signal processing capabilities. In implementation, each step of the foregoing method embodiment may be completed by an integrated logic circuit of hardware or instructions in the form of software in the processor. The processor includes: a general-purpose processor, a central processing unit (CPU), a network processor (NP), a digital signal processor (DSP), an application specific integrated circuit (ASIC), a field programmable gate array (FPGA), a complex programmable logic device (CPLD), a programmable logic array (PLA), a microcontroller unit (MCU) or other programmable logic device, a discrete gate, a transistor logic device, a discrete hardware component. The methods, steps, and logical block diagrams disclosed in the embodiments of the present disclosure may be implemented or performed. For example, the processor may be a single-core processor or a multi-core processor, and the processor may be integrated on a single chip or located on various chips.

The processor 1120 may be a microprocessor or any conventional processor. The steps of the method disclosed in the embodiments of the present disclosure may be directly performed and completed by a hardware decoding processor, or may be performed and completed by a combination of hardware and software modules in the decoding processor. The software module may be located in a readable storage medium known in the art such as a random-access memory (RAM), a flash memory, a read-only memory (ROM), a programmable read-only memory (PROM), an erasable programmable read-only memory (EPROM), and a register. The readable storage medium is located in the memory. The processor reads the information in the memory and completes the steps of the above method in combination with its hardware.

The bus 1110 further connects various other circuits such as a peripheral device, a voltage regulator, or a power management circuit, and the bus interface 1140 provides an interface between the bus 1110 and the transceiver 1130, which are well known in the art. Therefore, the bus 1110 and the bus interface 1140 are not further described in the embodiments of the present disclosure.

The transceiver 1130 may including one element or multiple elements, e.g., multiple receivers and transmitters, and provide a unit for communicating with various other devices on a transmission medium. For example, the transceiver 1130 receives external data from other devices, and sends the data processed by the processor 1120 to other devices. Depending on the nature of the computer system, a user interface 1160 may also be provided, including a touch screen, a physical keyboard, a display, a mouse, a speaker, a microphone, a trackball, a joystick, and a stylus.

It should be understood that, in the embodiments of the present disclosure, the memory 1150 may further include a memory remotely set with respect to the processor 1120. The remotely set memory may be connected to the server through a network. One or more parts of the above-mentioned network may be an ad hoc network, an intranet, an extranet, a virtual private network (VPN), a local area network (LAN), a wireless local area network (WLAN), a wide area network (WAN), a wireless wide area network (WWAN),a metropolitan area network (MAN), the Internet (Internet), a public switched telephone network (PSTN), an plain old telephone service network (POTS), a cellular telephone network, a wireless network, a wireless fidelity (Wi-Fi) network and a combination of two or more of the aforementioned networks. For example, the cellular telephone network and the wireless network each may be a global mobile communications (GSM) system, a code division multiple access (CDMA) system, a global interconnection for microwave access (WiMAX) system, a general packet radio service (GPRS) system, a broadband code division multiple access (WCDMA) system, a long-term evolution (LTE) system, an LTE frequency division duplex (FDD) system, an LTE time division duplex (TDD) system, an advanced long term evolution (LTE-A) system, a universal mobile telecommunications (UMTS) system, an enhanced mobile broadband (eMBB) system, a massive machine type of communication (mMTC) system, a ultra-reliable low latency communications (uRLLC) system and the like.

It should be understood that the memory 1150 in the embodiment of the present disclosure may be a volatile memory or a non-volatile memory, or may include both a volatile memory and a non-volatile memory. The non-volatile memory includes: a read-only memory (ROM), a programmable read-only memory (PROM), ab erasable programmable read-only memory (EPROM), an electrically erasable programmable read-only memory (EEPROM) or a flash memory.

The volatile memory includes: a random-access memory (RAM), which serves as an external cache. For illustration rather than limitation, various RAM are available, such as: a static random-access memory (SRAM), a dynamic random-access memory (DRAM), a synchronous dynamic random-access memory (SDRAM), a double data rate synchronous dynamic random-access memory (DDRSDRAM), an enhanced synchronous dynamic random-access memory (ESDRAM), a synchronous link dynamic random-access memory (SLDRAM) and a direct Rambus random access memory (DRRAM). The memory 1150 described in embodiments of the present disclosure includes, but is not limited to, the above-mentioned and any other suitable types of memory.

In the embodiments of the present disclosure, the memory 1150 stores the following elements of an operating system 1151 and an application program 1152: executable modules, data structures, or a subset thereof, or an extension set thereof.

Specifically, the operating system 1151 includes various system programs, such as a framework layer, a core library layer, a driver layer and the like, for implementing various basic services and processing hardware-based tasks. The application program 1152 includes various application programs, such as a media player and a browser, for implementing various application services. A program that implements the method of the embodiments of the present disclosure may be included in the application program 1152. The application program 1152 includes: an applet, an object, a component, logic, a data structure, and other computer system executable instructions that perform specific tasks or implement specific abstract data types.

In addition, a computer-readable storage medium on which a computer program is stored is further provided according to an embodiment of the present disclosure. When the computer program is executed by the processor, steps of the method for identifying parameters of the battery are implemented, and the same technical effects can be achieved. In order to avoid repetition, details are not repeated here.

The computer-readable storage medium includes permanent and non-permanent, removable and non-removable media, and is a tangible device that retains and stores instructions executed by an instruction execution device. The computer-readable storage medium includes: an electronic storage device, a magnetic storage device, an optical storage device, an electromagnetic storage device, a semiconductor storage device, and any suitable combination of the foregoing. The computer-readable storage medium includes: a phase change memory (PRAM), a static random access memory (SRAM), a dynamic random access memory (DRAM), other types of random access memory (RAM), a read-only memory (ROM), a non-volatile random access memory (NVRAM), an electrically erasable programmable read-only memory (EEPROM), a flash memory or other memories, a compact disc read-only memory (CD-ROM), a digital versatile disc (DVD) or other optical storage device, a magnetic cassette memory, a magnetic tape disk memory or other magnetic storage devices, a memory stick, a mechanical encoding device (such as a punched card or raised structure in a groove on which instructions are recorded) or any other non-transmission medium, and is configured to store information that can be accessed by a computing device. According to the definition in the embodiments of the present disclosure, the computer-readable storage medium does not include temporary signals, such as radio waves or other freely transmitted electromagnetic waves, electromagnetic waves transmitted through waveguides or other transmission media (e.g., a light pulse passing through an optical fiber cable) or electrical signals transmitted through wires.

In the embodiments of the present disclosure, it should be understood that the disclosed apparatus, device, and method may be implemented in other ways. For example, the device embodiments described above are only illustrative. For example, the division of the modules or units is only a logical function division, and there may be other division manners in actual implementation. For example, multiple units or components may be combined or integrated into another system, or some features may be omitted or not implemented. In addition, the shown or discussed mutual coupling or direct coupling or communication connection may be indirect coupling or communication connection through some interfaces, devices or units, and may also be electrical, mechanical or other forms of connection.

The units described as separate components may or may not be physically separate. Components shown as units may or may not be a physical unit, that is, may be located in one position or distributed on multiple network units. Some or all of the units may be selected according to actual needs to solve the problems to be solved by the solutions of the embodiments of the present disclosure.

In addition, the functional units in the various embodiments of the present disclosure may be integrated into one processing unit, or the units may separate physically, or two or more units may be integrated into one unit. The above-mentioned integrated unit may be implemented in the form of hardware or software functional unit.

If the integrated unit is implemented in the form of a software functional unit and sold or used as an independent product, the integrated unit may be stored in a computer-readable storage medium. Based on this understanding, the technical solutions of the embodiments of the present disclosure are essentially or a part that contributes to the conventional technology, or all or part of the technical solutions may be embodied in the form of a computer software product. The computer software product is stored in a storage medium and includes a number of instructions so that a computer device (such as a personal computer, a server, a data center or other network devices) execute all or part of the steps of the method described in the embodiments of the present disclosure. The aforementioned storage medium includes various media capable of storing program codes as listed above.

In the description of the embodiments of the present disclosure, those skilled in the art should understand that the embodiments of the present disclosure may be implemented as a method, an apparatus, a device, and a computer-readable storage medium. Therefore, the embodiments of the present disclosure may be specifically implemented in the following forms: complete hardware, complete software (including firmware, resident software, microcode and the like), and a combination of hardware and software. In addition, in some embodiments, the embodiments of the present disclosure may also be implemented in the form of a computer program product in one or more computer-readable storage media, and the computer-readable storage medium includes computer program codes.

The aforementioned computer-readable storage medium may adopt any combination of one or more computer-readable storage media. The computer-readable storage medium includes: an electrical, magnetic, optical, electro-magnetic, infrared, or semiconductor system, device, or device, or any combination of the above. More specific examples of computer-readable storage media include: a portable computer disk, a hard disk, a random-access memory (RAM), a read-only memory (ROM), an erasable programmable read-only memory (EPROM), a flash memory, an optical fiber, a compact disc read-only memory (CD-ROM), an optical storage device, a magnetic storage device or any combination of the above. In the embodiments of the present disclosure, the computer-readable storage medium may be any tangible medium that includes or stores a program, and the program may be executed by an instruction execution system, apparatus, or device, or in combination therewith.

The computer program code included in the above-mentioned computer-readable storage medium may be transmitted by any suitable medium, including: a wireless medium, a wired medium, an optical cable, radio frequency (RF), or any suitable combination of the above.

The computer program codes for implementing the operations in the embodiments of the present disclosure may be written in the form of assembly instructions, instruction set architecture (ISA) instructions, machine instructions, machine-related instructions, microcode, firmware instructions, state setting data, integrated circuit configuration data, or in one or more programming languages or a combination thereof. The programming language includes object-oriented programming languages, such as Java, Smalltalk, and C++, as well as conventional procedural programming languages, such as C language or similar programming languages. The computer program codes may be executed entirely on the user computer, partly on the user computer, executed as an independent software package, partly on the user computer and partly on a remote computer, and completely executed on a remote computer or server. In the case of a remote computer, the remote computer can be connected to a user computer or an external computer through any kind of network, including: a local area network (LAN) or a wide area network (WAN).

The embodiments of the present disclosure describe the provided method, apparatus, and the device through flow-charts and/or block diagrams.

It should be understood that each block in the flowcharts and/or block diagrams and the combination of blocks in the flowcharts and/or block diagrams may be implemented by computer readable program instructions. These computer-readable program instructions may be provided to the processor of a general-purpose computer, a special-purpose computer, or other programmable data processing device, to produce a machine. These computer-readable program instructions are executed by a computer or other programmable data processing device to generate a device that implements the functions/operations specified by the blocks in the flowcharts and/or block diagrams.

These computer-readable program instructions may also be stored in a computer-readable storage medium that can operate a computer or other programmable data processing device in a specific manner. In this way, the instructions stored in the computer-readable storage medium produce an instruction device product that includes the functions/operations specified in the blocks in the flowcharts and/or block diagrams.

Alternatively, the computer-readable program instructions are loaded onto a computer, other programmable data processing device, or other device, so that a series of operation steps are executed on the computer, other programmable data processing device, or other device to produce a computer-implemented process, so that the instructions executed on the computer or other programmable data processing device can provide a process for implementing the functions/operations specified by the blocks in the flow-charts and/or block diagrams.

Specific implementations of the embodiments of the present disclosure are described above, and the scope of protection of the embodiments of the present disclosure is not limited thereto. Any person skilled in the art can easily conceive of changes or substitutions within the technical scope disclosed in the embodiments of the present disclosure, and these changes or substitutions should be covered by the scope of protection of the embodiments of the present disclosure. Therefore, the scope of protection of the embodiments of the present disclosure should be subject to the protection scope of the claims.

The invention claimed is:

1. A method for identifying parameters of a battery, comprising:
   determining to-be-identified parameters of the battery and determining an initial population, wherein the initial population comprises N individuals each comprising all the to-be-identified parameters;
   performing a screening step with the initial population as a current population:
   for at least part of individuals in the current population, updating positions of the individuals in the current population through local optimization and generating corresponding first individuals, and updating the positions of the individuals in the current population through Levy flight and generating corresponding second individuals;
   selecting an optimal individual according to fitness of the individuals in the current population and the corresponding first individuals and the corresponding second individuals, as an individual in a next generation population, wherein the next generation population is determined as the current population in a next round of screening step;
   repeating the above screening step until a termination condition is met, to obtain a final population; and determining the to-be-identified parameters comprised in the optimal individual in the final population as the parameters of the battery, and monitoring physical and chemical changes inside the battery based on the determined parameters of the battery, wherein the updating the positions of the individuals in the current population through the Levy flight comprises: determining a step size in the Levy flight according to the number of screening steps and updating the positions of the individuals in the current population through the Levy flight, wherein there is a negative correlation between the step size and the number of screening steps, and the determining the step size in the Levy flight according to the number of screening steps comprises: determining the step size form an expression $$\alpha = \alpha_0 + \frac{\alpha_{range}}{1 + \exp^{(a(t-bT))}},$$

wherein $\alpha$ represents the step size in the Levy flight, $\alpha_0$ represents an initially set step size, $\alpha_{range}$ represents a range of the step size, T is the maximum number of screening steps, t is the current number of screening steps, and a and b represent set constants, $0 < a < 1$, and $1/3 < b < 2/3$;
   wherein the local optimization is performed based on the following equation:

$x_i^{t'} = x_i^t + r_1 \otimes H(P_a - r_2) \otimes (x_j^t - x_k^t)$ $x_i^t$ represents a position of an i-th sample individual in a t-th round, $x_i^{t'}$ represents a new position of the i-th sample individual after random migration, $r_1$ and $r_2$ represent random number vectors, $P_a$ represents a detection probability, $x_j^t$ and $x_k^t$ respectively represent two randomly selected individuals in the current population, and H( ) represents a Heaviside function.

2. The method according to claim 1, wherein the updating the positions of the individuals in the current population through the local optimization comprises:
   calculating the detection probability of the individuals in the current population according to the fitness of the individuals in the current population, and updating the positions of the individuals in the current population through the local optimization according to the detection probability, wherein there is a positive correlation between the detection probability of the individuals and the fitness of the individuals.

3. The method according to claim 2, wherein the calculating the detection probability of the individuals in the current population according to the fitness of the individuals in the current population comprises: calculating the detection probability form an expression $$p_t = p_a \left| \frac{f_i - f_{best}}{f_{worst} - f_{best}} \right|,$$

wherein $p_i$ represents the detection probability of an $i^{th}$ individual, $p_a$ represents a maximum detection probability, $f_i$ represents fitness of the $i^{th}$ individual, and $f_{best}$ and $f_{worst}$ represent the fitness of a best individual and a worst individual respectively.

4. The method according to claim 1, wherein
   in the screening step, before the local optimization and the Levy flight, for at least the part of individuals in the current population, the positions of the individuals in the current population are updated through gravitational search to generate corresponding intermediate individuals; and the optimal individual is selected according to the fitness of the individuals in the current population and the corresponding intermediate individuals, as the individual in the current population in a current screening step.

5. The method according to claim 1, wherein the determining the initial population comprises:
   acquiring a random population based on chaos operator initialization; calculating a reverse population for the random population; merging the random population and the reverse population; and selecting a new population according to the fitness of each individual, as the initial population.

6. An apparatus for identifying parameters of a battery, comprising:
   a determination module configured to determine to-be-identified parameters of the battery and determine an initial population, wherein the initial population comprises N individuals each comprising all the to-be-identified parameters, and the initial population is determined as a current population;
   a screening module configured to perform a screening step: for at least part of individuals in the current population, updating positions of the individuals in the current population through local optimization and generating corresponding first individuals, updating the positions of the individuals in the current population through Levy flight and generating corresponding second individuals; selecting an optimal individual as an individual in the next generation population according to fitness of the individuals in the current population and the corresponding first individuals and the corresponding second individuals, wherein the next generation population is determined as the current population for a next round of screening;
   an iteration determination module configured to repeat the screening step until a termination condition is met, to obtain a final population; and
   an output module configured to determine the to-be-identified parameters comprised in the optimal individual in the final population as the parameters of the battery, and monitor physical and chemical changes inside the battery based on the determined parameters of the battery, wherein the screening module comprises a Levy flight module configured to determine a step size in the Levy flight according to the number of screening steps and update the positions of the individuals in the current population through the Levy flight, wherein there is a negative correlation between the step size and the number of screening steps, and the Levy flight module is configured to determine the step size in the Levy flight according to the number of screening steps form an expression $$\alpha = \alpha_0 + \frac{\alpha_{range}}{1 + \exp^{(a(t-bT))}},$$

wherein $\alpha$ represents the step size in the Levy flight, $\alpha_0$ represents an initially set step size, $\alpha_{range}$ represents a range of the step size, T is the maximum number of screening steps, t is the current number of screening steps, and a and b represent set constants, 0<a<1, and ⅓<b<⅔;

wherein the local optimization is performed based on the following equation:

$x_i^{t'} = x_i^t + r_1 \otimes H(P_a - r_2) \otimes (x_j^t - x_k^t)$ $x_i^t$ represents a position of an i-th sample individual in a t-th round, $x_i^{t'}$ represents a new position of the i-th sample individual after random migration, $r_1$ and $r_2$ represent random number vectors, $P_a$ represents a detection probability, $x_j^t$ and $x_k^t$ respectively represent two randomly selected individuals in the current population. and H( ) represents a Heaviside function.

7. An electronic device, comprising a processor and a memory, wherein the memory storing a computer program, and the processor is configured to execute the computer program stored in the memory to implement the method for identifying parameters of a battery, wherein the method comprises:

determining to-be-identified parameters of the battery and determining an initial population, wherein the initial population comprises N individuals each comprising all the to-be-identified parameters; performing a screening step with the initial population as a current population:

for at least part of individuals in the current population, updating positions of the individuals in the current population through local optimization and generating corresponding first individuals, and updating the positions of the individuals in the current population through Levy flight and generating corresponding second individuals;

selecting an optimal individual according to fitness of the individuals in the current population and the corresponding first individuals and the corresponding second individuals, as an individual in a next generation population, wherein the next generation population is determined as the current population in a next round of screening step;

repeating the above screening step until a termination condition is met, to obtain a final population; and determining the to-be-identified parameters comprised in the optimal individual in the final population as the parameters of the battery, and monitoring physical and chemical changes inside the battery based on the determined parameters of the battery, wherein the updating the positions of the individuals in the current population through the Levy flight comprises: determining a step size in the Levy flight according to the number of screening steps and updating the positions of the individuals in the current population through the Levy flight, wherein there is a negative correlation between the step size and the number of screening steps, and the determining the step size in the Levy flight according to the number of screening steps comprises: determining the step size form an expression $$\alpha = \alpha_0 + \frac{\alpha_{range}}{1 + \exp^{(a(t-bT))}},$$

wherein $\alpha$ represents the step size in the Levy flight, $\alpha_0$ represents an initially set step size, $\alpha_{range}$ represents a range of the step size, T is the maximum number of screening steps, t is the current number of screening steps, and a and b represent set constants, 0<a<1, and ⅓<b<⅔;

wherein the local optimization is performed based on the following equation:

$x_i^{t'} = x_i^t + r_1 \otimes H(P_a - r_2) \otimes (x_j^t - x_k^t)$ $x_i^t$ represents a position of an i-th sample individual in a t-th round, $x_i^{t'}$ represents a new position of the i-th sample individual after random migration, $r_1$ and $r_2$ represent random number vectors, $P_a$ represents a detection probability, $x_j^t$ and $x_k^t$ respectively represent two randomly selected individuals in the current population, and H( ) represents a Heaviside function.

8. A computer-readable storage medium with a computer program stored thereon, wherein when the computer program is executed by a processor, the method for identifying parameters of a battery is implemented, wherein the method comprises:

determining to-be-identified parameters of the battery and determining an initial population, wherein the initial population comprises N individuals each comprising all the to-be-identified parameters; performing a screening step with the initial population as a current population:

for at least part of individuals in the current population, updating positions of the individuals in the current population through local optimization and generating corresponding first individuals, and updating the positions of the individuals in the current population through Levy flight and generating corresponding second individuals;

selecting an optimal individual according to fitness of the individuals in the current population and the corresponding first individuals and the corresponding second individuals, as an individual in a next generation population, wherein the next generation population is determined as the current population in a next round of screening step;

repeating the above screening step until a termination condition is met, to obtain a final population; and determining the to-be-identified parameters comprised in the optimal individual in the final population as the parameters of the battery, and monitoring physical and chemical changes inside the battery based on the determined parameters of the battery, wherein the updating the positions of the individuals in the current population through the Levy flight comprises: determining a step size in the Levy flight according to the number of screening steps and updating the positions of the individuals in the current population through the Levy flight, wherein there is a negative correlation between the step size and the number of screening steps, and the determining the step size in the Levy flight according to the number of screening steps comprises: determining the step size form an expression $$\alpha = \alpha_0 + \frac{\alpha_{range}}{1 + \exp^{(a(t-bT))}},$$

wherein $\alpha$ represents the step size in the Levy flight, $\alpha_0$ represents an initially set step size, $\alpha_{range}$ represents a range of the step size, T is the maximum number of screening steps, t is the current number of screening steps, and a and b represent set constants, $0<a<1$, and $\frac{1}{3}<b<\frac{2}{3}$;

wherein the local optimization is performed based on the following equation:

$$x_i^{t'} = x_i^t + r_1 \otimes H(P_a - r_2) \otimes (x_j^t - x_k^t)$$

$x_i^t$ represents a position of an i-th sample individual in a t-th round, $x_i^{t'}$ represents a new position of the i-th sample individual after random migration, $r_1$ and $r_2$ represent random number vectors, $P_a$ represents a detection probability, $x_j^t$ and $x_k^t$ respectively represent two randomly selected individuals in the current population, and H( ) represents a Heaviside function.

* * * * *